(12) United States Patent
Potasek et al.

(10) Patent No.: US 9,010,190 B2
(45) Date of Patent: Apr. 21, 2015

(54) STRESS ISOLATED MEMS STRUCTURES AND METHODS OF MANUFACTURE

(75) Inventors: David P. Potasek, Minneapolis, MN (US); John C. Christenson, Prior Lake, MN (US); Bruce H. Satterlund, Eagan, MN (US); Randy Phillips, Farmington, MN (US); Dave Holmquist, Apple Valley, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 379 days.

(21) Appl. No.: 13/451,790

(22) Filed: Apr. 20, 2012

(65) Prior Publication Data

US 2013/0276544 A1 Oct. 24, 2013

(51) Int. Cl.
*G01L 7/08* (2006.01)
*B81B 7/00* (2006.01)

(52) U.S. Cl.
CPC .................................. *B81B 7/0048* (2013.01)

(58) Field of Classification Search
CPC .................................................... B81B 7/0048
See application file for complete search history.

(56) References Cited

U.S. PATENT DOCUMENTS

| | | | |
|---|---|---|---|
| 5,483,834 A | 1/1996 | Frick | |
| 5,996,419 A * | 12/1999 | Sokn | 73/706 |
| 2008/0006092 A1 * | 1/2008 | Brida et al. | 73/715 |
| 2010/0122583 A1 * | 5/2010 | Rozgo et al. | 73/861.47 |

* cited by examiner

*Primary Examiner* — Lisa Caputo
*Assistant Examiner* — Brandi N Hopkins
(74) *Attorney, Agent, or Firm* — Locke Lord LLP; Scott D. Wofsy; Joshua L. Jones

(57) ABSTRACT

A MEMS pressure sensor may be manufactured to include a backing substrate having a diaphragm backing portion and a pedestal portion. A diaphragm substrate may be manufactured to include a pedestal portion and a diaphragm that is mounted to the diaphragm backing portion of the backing substrate to form a stress isolated MEMS die. The pedestal portions of the backing and diaphragm substrates form a pedestal of the stress isolated MEMS die. The pedestal is configured for isolating the diaphragm from stresses including packaging and mounting stress imparted on the stress isolated MEMS die.

19 Claims, 13 Drawing Sheets

Base wafer manufacturer sub-process

Topping wafer manufacturer sub-process

Backing wafer manufacturer sub-process

Device wafer manufacturer sub-process

Device wafer manufacturer sub-process

Component wafer stack manufacturer sub-process

STRESS ISOLATED MEMS STRUCTURES AND METHODS OF MANUFACTURE

BACKGROUND OF THE INVENTION

1. Field of the Invention

The present invention relates to packaging stress mitigation for semiconductor dies, and more particularly to packaging stress mitigation for MEMS dies such as in MEMS pressure sensors.

2. Description of Related Art

A variety of devices are known in the art for isolating semiconductor dies from packaging stress and the like. Packaging stress is the stress imparted on a semiconductor die by the package to which it is mounted. This can arise due to the semiconductor die having a different coefficient of thermal expansion from the packaging to which it is mounted and/or from the adhesive mounting the die to the package. In such cases, a change in temperature can cause a stress/strain on the semiconductor die, and depending on the function of the die, this stress/strain can impair performance. Packaging stress can also be caused by mechanical mounting stress from how the die is mounted in the package and how the package itself is mounted in its surroundings.

In one example of packaging stress, traditional piezo resistive MEMS pressure sensors are designed to sense the stress on a diaphragm due to an applied pressure. It is therefore important that the only stress that the piezo resistors experience is due to the applied pressure and not to packaging stress. In such sensor packages, for example where a semiconductor MEMS die is directly mounted to a metallic package, there can be significant packaging stress due to mechanical mounting stress and thermal expansion stress as explained above. Such traditional sensor packages can be made at a relatively low cost, but the packaging stress on the diaphragm makes pressure measurement problematic in terms of accuracy.

Some measures have been taken to address these problems associated with packaging stress. For example, in some traditional MEMS pressure sensor packages, packaging stress mitigation was achieved by thickening the topping and backing wafers enclosing the diaphragm, adding a pedestal made of Pyrex® (available from Corning Incorporated of Corning, N.Y.) between the package and MEMS die, and using a large, custom package to house it all. These measures have been found to provided ten times increase of accuracy in pressure measurements made with the sensor packages so configured. However, the stress mitigation features add to the cost and size of the sensor packages.

Such conventional methods and systems have generally been considered satisfactory for their intended purpose. However, there is still a need in the art for systems and methods of mitigating packaging stress. There also remains a need in the art for such systems and methods that are easy to make and use. The present invention provides a solution for these problems.

SUMMARY OF THE INVENTION

The subject invention is directed to a new and useful microstructure device. The microstructure device includes a device body having a stress-isolated region including at least one stress-sensitive component. The microstructure device also includes a mounting base configured and adapted to be affixed to a package housing the device body, wherein the mounting base is laterally offset from the stress isolated region along the device body for isolating the stress-sensitive component from packaging stress imparted on the mounting base.

In certain embodiments, the device body is a planar wafer component defining the stress-sensitive component and mounting base. The stress-isolated region and the mounting base can be separated by a pedestal defined and formed in the device body, e.g., during its manufacture, wherein the pedestal has a width less than that of the stress-isolated region and of the mounting base. The microstructure device can further include a package mounted to an edge of the mounting base, wherein the edge of the mounting base faces away from the stress-isolated region of the device body.

It is also contemplated that the stress-sensitive component can include a media sensor, such as a humidity sensor, flow sensor, chemical sensor, gas analyzer, particle detector, pressure sensor, and/or any other suitable type of media sensor. The media sensor can be in fluid communication with ambient conditions through a flow passage defined between the device body and a second body that is a wafer component adhered to the device body. The flow passage can have a cross-section, the smallest linear dimension of which is smaller than that of a sensor cavity in fluid communication therewith adjacent to the media sensor. The stress-isolated region, stress-sensitive component, and mounting base can all be defined in a single crystal silicon wafer component, formed for example during manufacture.

The invention also includes a MEMS pressure sensor. The MEMS pressure sensor includes a backing substrate having a diaphragm backing portion and a pedestal portion. A diaphragm substrate including a pedestal portion and a diaphragm is mounted to the diaphragm backing portion of the backing substrate to form a MEMS die. The pedestal portions of the backing and diaphragm substrates form a pedestal of the MEMS die. The pedestal is configured for isolating the diaphragm from packaging stress imparted on a mounting base of the MEMS die opposite the diaphragm across the pedestal.

In certain embodiments, the MEMS pressure sensor includes an integral package configured and adapted to house the MEMS die, wherein the mounting base of the MEMS die is mounted to the package to isolate the diaphragm from the package for packaging stress mitigation. The backing substrate and diaphragm substrate can be silicon layers. The pedestal portion of the backing substrate can be substantially in plane with and narrower than the diaphragm backing portion, and the pedestal portion of the diaphragm substrate can similarly be substantially in plane with and narrower than the diaphragm.

It is contemplated that the pedestal portions of the diaphragm and backing substrates can be adjacent one another, and wherein each pedestal portion is defined between a pair of channels extending through the respective substrate, wherein the respective channels of the pedestal portions are conjoined. It is also contemplated that the diaphragm can be thinner than a diaphragm rim surrounding at least a portion of the diaphragm. The diaphragm rim can be adhered to the diaphragm backing portion of the backing substrate so that a void is defined between the diaphragm and the diaphragm backing portion of the backing substrate. A pressure port can be defined through the backing substrate for fluid communication between the void and the environment external thereto.

In certain embodiments, a topping wafer is mounted to the diaphragm substrate on a side opposite the backing substrate to enclose the diaphragm between the topping and backing substrates. A base wafer is mounted to the mounting base of the MEMS die. The topping wafer and base wafer form an enclosure about the diaphragm and diaphragm backing portion of the backing substrate. The diaphragm and diaphragm backing portion of the backing substrate are suspended within the enclosure by the pedestal for isolation of the diaphragm from packaging stresses from the topping wafer and base wafer, as well as stresses from mounting the assembly to a package, header or circuit card or mounting integrated electronics to the assembly, or the like.

In certain embodiments, a channel is defined through the diaphragm and backing substrates. A portion of the channel substantially surrounds the diaphragm rim. Two ends of the channel define the pedestal there between in the diaphragm and backing substrates. The diaphragm and backing substrates include an outer rim outboard of the portion of the channel substantially surrounding the diaphragm rim. The outer rim is spaced apart from the diaphragm and diaphragm backing portion across the channel. The outer rim can be contiguous with the mounting base.

An outer rim, topping wafer, and base wafer as described above are all included in certain embodiments. The topping wafer is mounted to the diaphragm substrate on the outer rim and mounting base with a topping void defined between the topping wafer and the diaphragm. The base wafer is mounted to the backing substrate on the outer rim and mounting base with a base void defined between the base wafer and the diaphragm backing portion of the backing substrate. The topping wafer, base wafer, outer rim, and mounting base are all integral to the MEMS device and are each manufactured specifically to function as a diaphragm enclosure around the diaphragm and diaphragm backing portion for mitigation of mounting and packaging stress on the diaphragm from the enclosure and from external stresses.

An integrated electronics component can be mounted to one of the topping wafer and base wafer. The integrated electronics component, topping wafer, and base wafer can all be substantially formed of silicon. It is also contemplated that an integrated electronics component may be formed to serve the same function as either a topping or backing wafer, or both.

The diaphragm void can form a first pressure space configured to deflect the diaphragm in a first direction under pressure, wherein the topping and base voids are in fluid communication through the channel in the diaphragm and backing substrates to form a second pressure space configured to deflect the diaphragm in a second direction opposite the first direction under pressure. The diaphragm enclosure can include a first pressure port in fluid communication with the first pressure space. The second pressure space can be hermetically sealed for sensing absolute pressure of an external pressure source in fluid communication with the first pressure space.

It is also contemplated that the diaphragm enclosure can include a first pressure port and a second pressure port in fluid communication with the first and second pressure spaces, respectively. The first and second pressure spaces can be sealed from one another within the diaphragm enclosure for sensing differential pressure between respective first and second external pressure sources across the diaphragm A sensor package can enclose the diaphragm enclosure, wherein each of the first and second pressure ports of the diaphragm enclosure is in fluid communication with a respective pressure opening through the sensor package for connection to a respective pressure source. A hermetically sealed space can be defined between the sensor package and the diaphragm enclosure for protecting the diaphragm enclosure from ambient conditions.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION OF THE PREFERRED EMBODIMENTS

Figure 1:
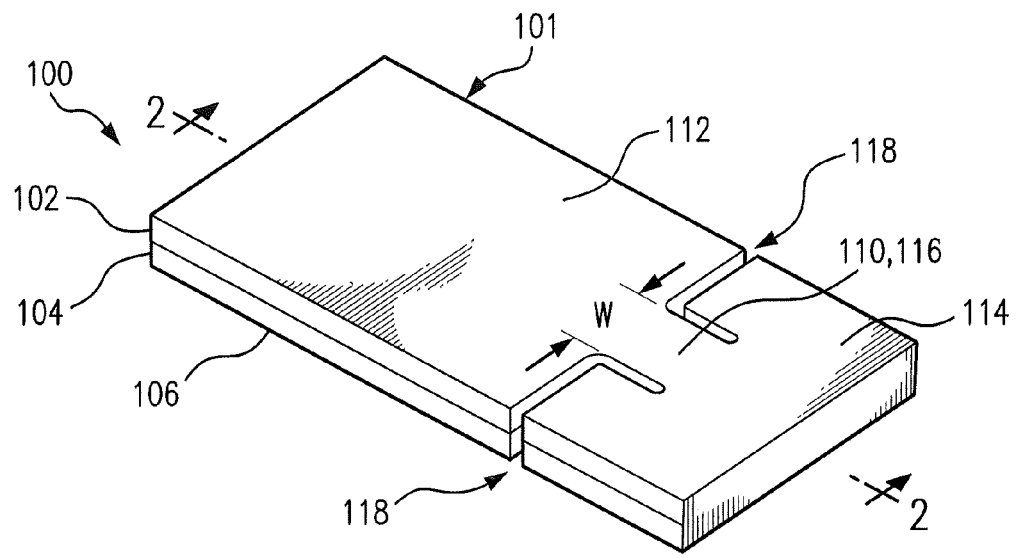
FIG. 1 is a perspective view of a portion of an exemplary embodiment of a MEMS pressure sensor constructed in accordance with the present invention, showing the pedestal defined in the backing substrate and diaphragm substrate.

Reference will now be made to the drawings wherein like reference numerals identify similar structural features or aspects of the subject invention. For purposes of explanation and illustration, and not limitation, a partial view of an exemplary embodiment of a MEMS pressure sensor in accordance with the invention is shown in FIG. 1 and is designated generally by reference character 100. Other embodiments of MEMS pressure sensors and methods of manufacturing MEMS pressure sensors in accordance with the invention, or aspects thereof, are provided in FIGS. 2-23, as will be described. The systems and methods of the invention can be used to improve pressure sensor performance by mitigating packaging and mounting stresses.

Figure 2:
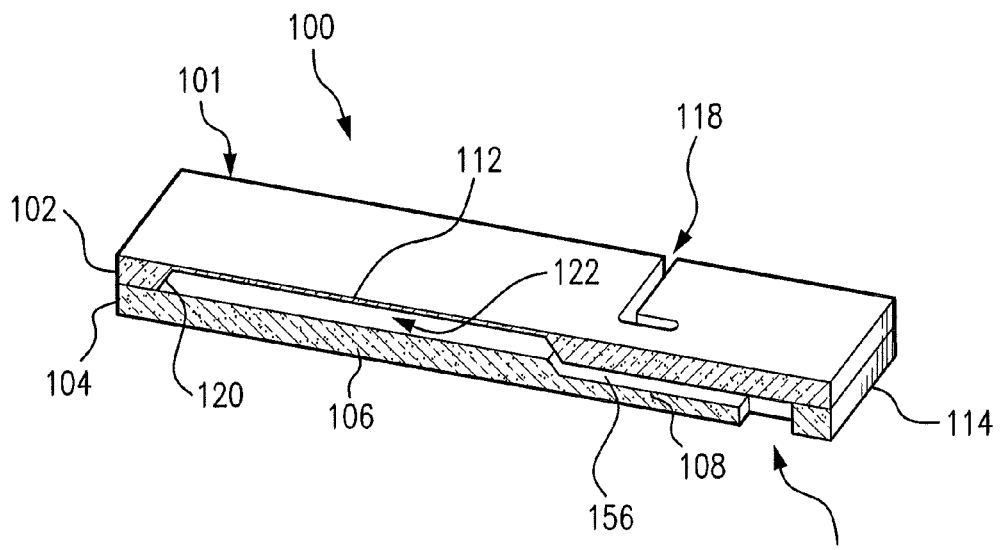
FIG. 2 is a cross-sectional perspective view of the backing and diaphragm substrates of FIG. 1, showing the diaphragm and diaphragm void.

Referring now to FIG. 1, MEMS pressure sensor 100 includes a backing substrate 104 having a diaphragm backing portion 106 and a pedestal portion 108, which is shown in FIG. 2. A diaphragm substrate 102 including a pedestal portion 110 and a diaphragm 112 is mounted to diaphragm backing portion 106 of backing substrate 104 to form a MEMS die 101. The pedestal portions 108 and 110 of the backing and diaphragm substrates 102 and 104 form a pedestal 116 of the MEMS die. Pedestal 116 isolates diaphragm 112 from packaging stress imparted on a mounting base 114 of the MEMS die opposite from the diaphragm 112 across pedestal 116. Pedestal portion 108 of backing substrate 104 is in plane with and narrower than the diaphragm backing portion 106. Pedestal portion 110 of diaphragm substrate 102 is similarly in plane with and narrower than diaphragm 112.

With continued reference to FIGS. 1-2, the pedestal portions 108 and 110 of the diaphragm and backing substrates 102 and 104 are adjacent one another. Each pedestal portion 108 and 110 is defined between a pair of channels 118 extending through the respective substrates 102 and 104. The respective channels 118 of the pedestal portions 108 and 110 are conjoined so in effect there is one contiguous channel 118 nearly surrounding pedestal 116. Pedestal 116 has a width W between opposed channels 118. Width W can be varied from application to application. Generally, the higher the aspect ratio between W and the width of diaphragm 112, the more packaging stress isolation can be achieved. Width W can be tuned for acceptable stiffness for a given applications' operational vibration frequency, i.e., to reduce resonance in MEMS die 101 with environmental frequencies, as well as for shock survivability/resistance and acceleration resistance. It is possible for width W to be the entire width of MEMS die 101 if channels 118 along the length of pedestal 116 are formed to be straight instead of bent. In this case, stress isolation is still achieved by having diaphragm 112 laterally offset from mounting base 114.

The corners in channels 118 are rounded in a general aim to avoid sharp corners and other stress risers or concentrations. Rounded corners not only reduce stress concentration, but are also better for the uniformity of an anisotropic etch, such as in a Deep Reactive Ion Etch (DRIE) etch process. Moreover, in MEMS die 101, pedestal 116 is of the same uniform material, and integral with the substrates 102 and 104, which eliminates stress concentrations between pedestal 116 and substrates 102 and 104 that could otherwise accompany joints between two separate components or materials.

Referring now to FIG. 2, diaphragm 112 is thinner than the diaphragm rim 120 surrounding diaphragm 112, to make diaphragm 112 sensitive to changes in pressure. Diaphragm rim 120 is adhered to diaphragm backing portion 106 of backing substrate 104 and a diaphragm void 122 is defined between diaphragm 112 and diaphragm backing portion 106. A pressure port 124 is defined through the backing substrate for fluid communication between the void and the environment external thereto through path 156.

Figure 3:
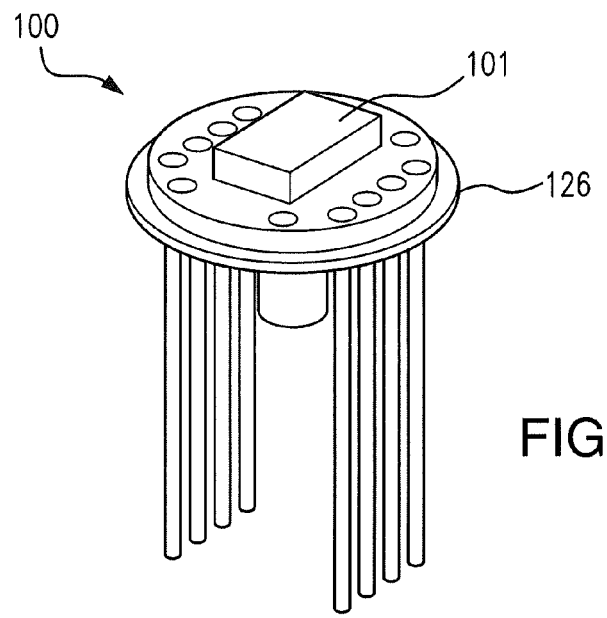
FIG. 3 is a perspective view of a the MEMS pressure sensor of FIG. 1, showing the MEMS die mounted to a package for sensing pressure.

With reference now to FIG. 3, MEMS pressure sensor 100 includes a package housing header 126 configured and adapted to house MEMS die 101. The attachment of MEMS die 101 to package housing header 126 is by way of mounting base 114 (not shown in FIG. 3, but see FIGS. 1-2) being mounted to package housing header 126, with backing portion 106 (identified in FIG. 2) of backing substrate 104 not directly mounted or adhered to package housing header 126. Mounting MEMS die 101 to package housing header 126 in this manner isolates diaphragm 112 from package housing header 126 for packaging stress mitigation. Note that in FIG. 2 the cover of the package is not shown, but see, e.g., outer cap 340 in FIG. 11.

Figure 4:
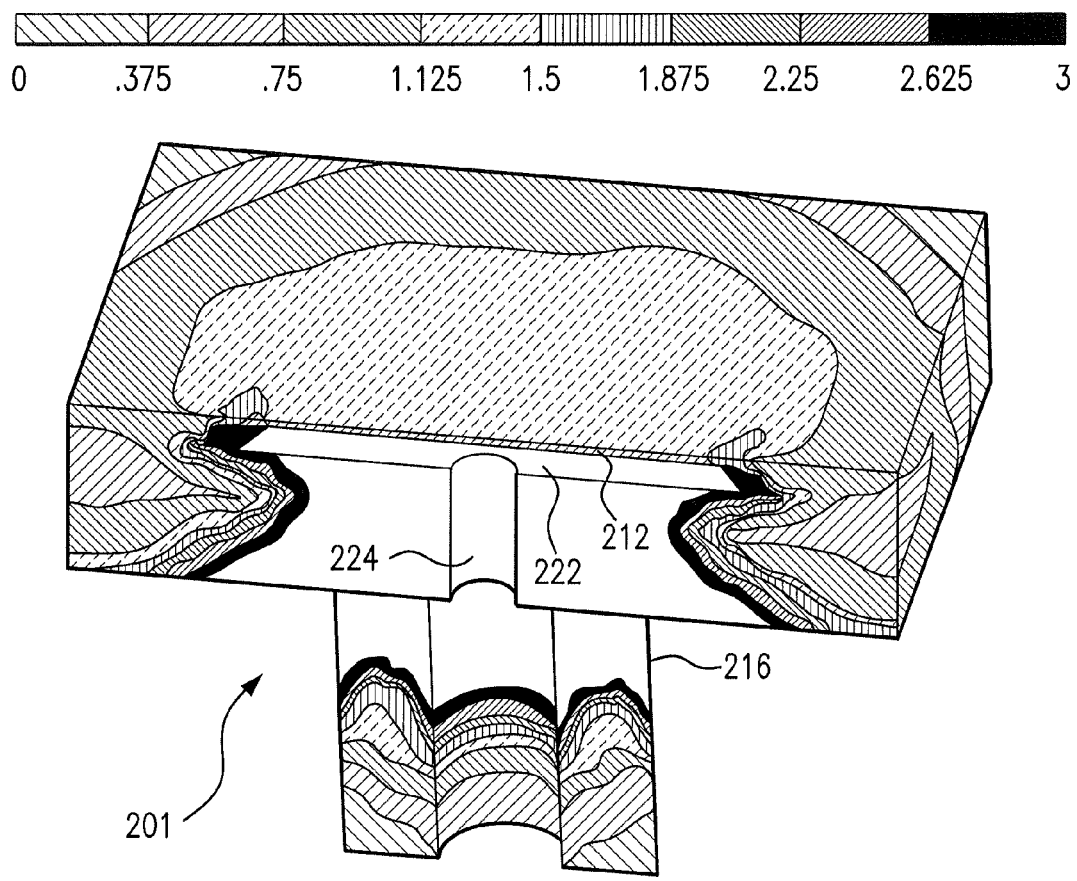
FIG. 4 is a perspective view of a pressure sensing die of the prior art mounted to a pedestal out of plane with the wafers/substrates, schematically showing how stress from the pedestal is imparted onto the diaphragm.

Referring now to FIG. 4, one approach to packaging stress isolation known in the art is to separate the MEMS die from the package housing with a pedestal therebetween. MEMS die 201 includes a diaphragm 212, diaphragm void 222, and pressure port 224. Unlike in MEMS die 101 described above, in MEMS die 201, pedestal 216 is not substantially in plane with the substrates of the die. Instead, pedestal 216 is interposed between the planes of MEMS die 201 and the package housing (not shown in FIG. 4, but see, e.g., FIG. 3) as a stand-off. This provides some packaging stress mitigation, however, as indicated schematically in FIG. 4, at least some packaging stress from pedestal 216 is imposed on diaphragm 212, which can lead to pressure measurement error as described above. As indicated by the cross-hatching in FIG. 4, when 3 units of stress are present in pedestal 216, as much as 1.5 units of stress are imparted on the majority of diaphragm 212. While the pedestal configuration of MEMS die 201 provides about 10 times increase accuracy over traditional MEMS pressure sensors due to packaging stress isolation, it has been found in conjunction with the subject invention that the in plane pedestal configuration of MEMS die 101 provides about 3 times increased accuracy over MEMS die 201.

Figure 5:
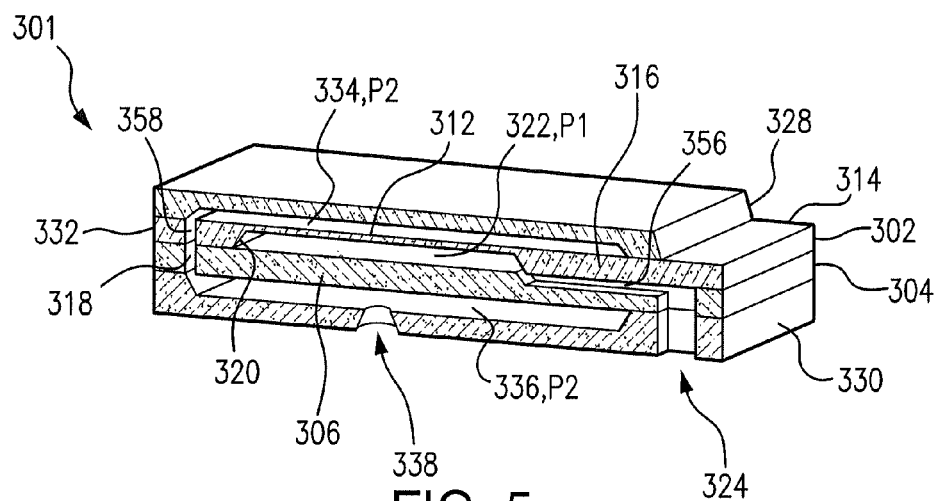
FIG. 5 is a cross-sectional perspective view of another exemplary embodiment of a MEMS pressure sensor constructed in accordance with the present invention, showing a stress isolation cavity around the diaphragm and diaphragm backing portion of the diaphragm and backing substrates.
Figure 6:
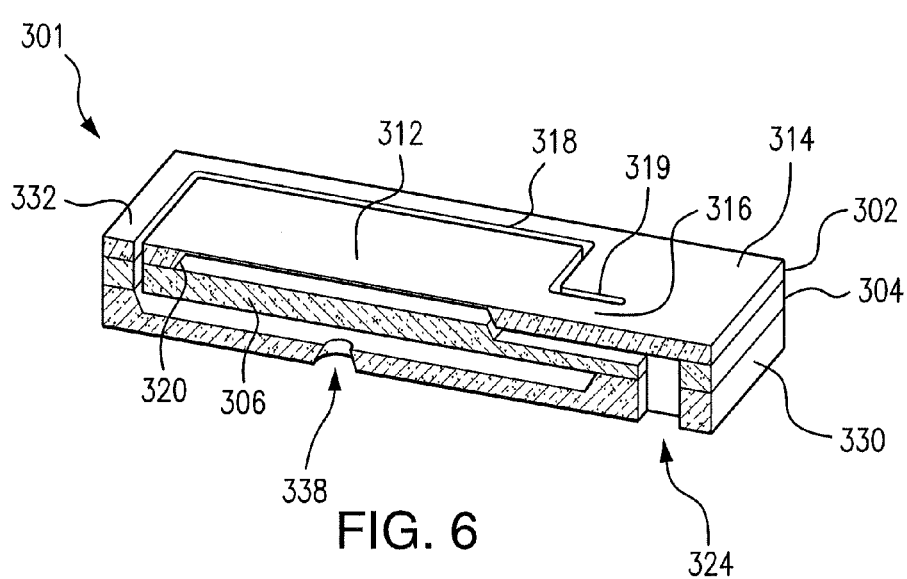
FIG. 6 is a cross-sectional perspective view of the MEMS pressure sensor of FIG. 5, showing the channel and outer rim of the diaphragm substrate with the topping wafer removed.

Referring now to FIGS. 5-6, another exemplary embodiment of a MEMS die 301 is shown in which advantageously shaped wafers form an enclosure around the diaphragm and diaphragm backing portion. In addition to a diaphragm substrate 302 and backing substrate 304 much as those described above, MEMS die 301 includes a topping wafer 328 mounted to diaphragm substrate 302 on the side opposite of backing substrate 304. This encloses diaphragm 312 between topping wafer 328 and backing substrate 304. A base wafer 330 is mounted to the side of backing substrate 304 opposite of diaphragm substrate 302. Topping wafer 328 and base wafer 330 form an enclosure about diaphragm 312 and diaphragm backing portion 306. Diaphragm 312 and diaphragm backing portion 306 of backing substrate 304 are suspended within the enclosure by pedestal 316 for isolation of diaphragm 312 from external sources of stress such as mounting and packaging stresses exerted upon topping wafer 328 and base wafer 330.

With reference to FIG. 6, channel 318 is defined through the diaphragm and backing substrates 302 and 304. A portion of channel 318 substantially surrounds diaphragm rim 320. The two ends 319 of channel 318 define pedestal 316 therebetween in the diaphragm and backing substrates 302 and 304, much as described above with reference to FIG. 1. The diaphragm and backing substrates 302 and 304 include an outer rim 332 outboard of the portion of channel 318 substantially surrounding diaphragm rim 320. Outer rim 332 is spaced apart from diaphragm 312 and diaphragm backing portion 306 across channel 318. Outer rim 332 is contiguous with mounting base 314.

Referring again to FIG. 5, topping wafer 328 is mounted to diaphragm substrate 302 on outer rim 332 and mounting base 314 with a topping void 334 defined between topping wafer 328 and diaphragm 312. Base wafer 330 is mounted to backing substrate 304 on outer rim 332 and mounting base 314 with a base void 336 defined between base wafer 330 and the diaphragm backing portion 306 of the backing substrate 304. Topping wafer 328, base wafer 330, outer rim 332, and mounting base 314 form a diaphragm enclosure or stress isolation cavity around diaphragm 312 and diaphragm backing portion 306 for mitigation of packaging stress on diaphragm 312 from the internal stresses, such as packaging and mounting stresses, that are coupled to the enclosure. Channel 318 is contained within the enclosure.

Diaphragm void 322 forms a first pressure space at pressure P1 configured to deflect diaphragm 312 in a first direction under pressure. Topping and base voids 334 and 336 are in fluid communication through channel 318 to form a second pressure space under pressure P2 configured to deflect diaphragm 312 in a second direction opposite the first direction under pressure. The diaphragm enclosure includes a first pressure port 324 in fluid communication with the first pressure space. The diaphragm enclosure also includes a second pressure port 338 in fluid communication with the second pressure space. The first and second pressure spaces are sealed from one another within the diaphragm enclosure for sensing differential pressure between respective first and second external pressure sources P1 and P2 across diaphragm 312.

Figure 7:
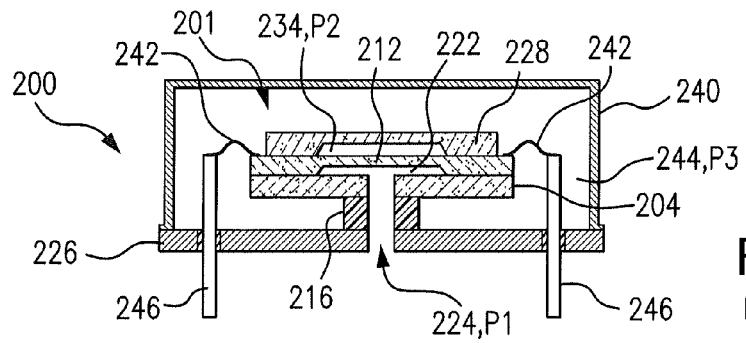
FIG. 7 is a schematic cross-sectional elevation view of an exemplary absolute pressure sensor of the prior art, showing the one pressure port in fluid communication with the diaphragm.

Referring now to FIG. 7, an exemplary absolute pressure sensor 200 of the prior art is shown schematically, including MEMS die 201 as shown in FIG. 4 and described above. Sensor 200 has a single pressure port 224 passing through package housing 226, pedestal 216, and backing substrate 204 into diaphragm void 222. On the opposite side of diaphragm 212 from diaphragm void 222 is a topping void 234, which can be maintained at a low pressure P2 such as a vacuum or near vacuum, for example, between the diaphragm 212 and topping wafer 228. An inert medium such as nitrogen instead of a vacuum can also be used within topping void 234. An outer cap 240 forms an enclosure with package housing 226 about the exterior of MEMS die 201, providing protection for wire bonds 242 in space 244 from external conditions. Wire bonds 242 provide for electrical communication between MEMS die 201 and pins 246, which pass through package housing 226 in a sealed manner to allow for electrical communication between the exterior portions of pins 246 and wire bonds 242. Space 244 can be maintained at a constant pressure, P3. This configuration allows for absolute pressure measurements of P1 through pressure port 224.

Figure 8:
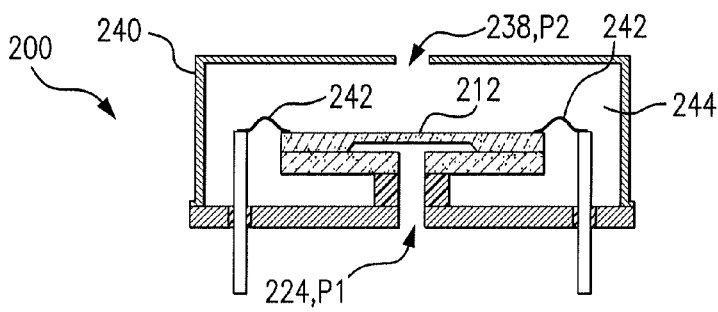
FIG. 8 is a schematic cross-sectional elevation view of an exemplary differential pressure sensor of the prior art, showing the two pressure ports in fluid communication with the diaphragm.

With reference now to FIG. 8, if differential pressure measurements are desired, sensor 200 can be modified accordingly. In particular, a second pressure port 238 can be fondled in outer cap 240, and topping wafer 228 can be dispensed with. This allows a first pressure, P1, to act on diaphragm 212 in a first direction, and allows the second pressure P2 to act on diaphragm 212 in a second direction opposite the first direction. Differential pressure between P1 and P2 can therefore be determined by monitoring diaphragm 212.

Figure 9:
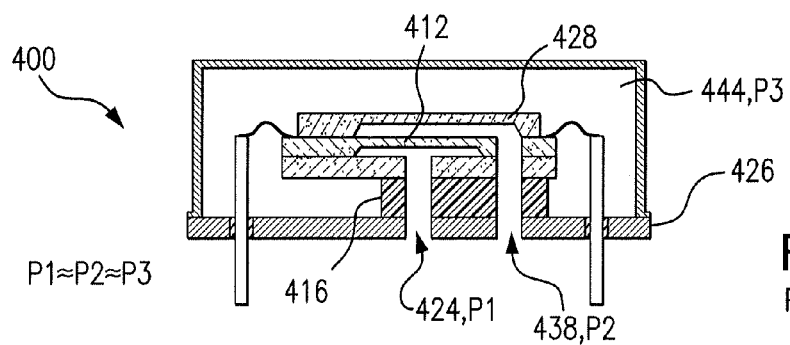
FIG. 9 is a schematic cross-sectional elevation view of an exemplary differential pressure sensor of the prior art, showing two pressure ports, each sealed off from the wire bonds, where the pressure at the two pressure ports is approximately equal to the pressure in the wire bond space.
Figure 10:
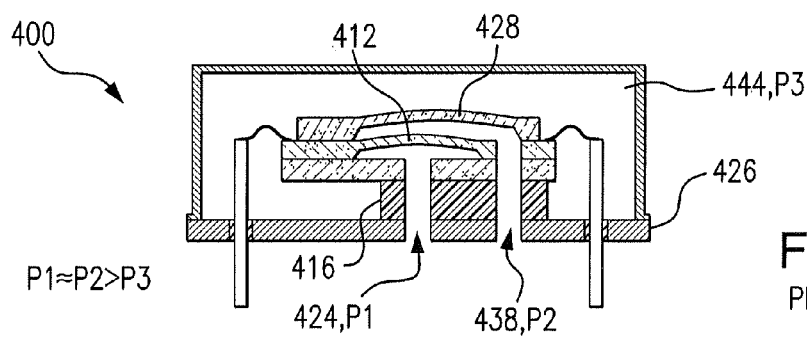
FIG. 10 is a schematic cross-sectional elevation view of the differential pressure sensor of FIG. 9, wherein the pressure at the two pressure ports is significantly greater than the pressure in the wire bond space.

The differential pressure configuration of MEMS sensor 200 shown in FIG. 8 does not provide a sealed space 244, so wire bonds 242 and other sensitive components may be exposed to harmful, e.g., corrosive, elements communicating through pressure port 238. FIGS. 9 and 10 show a solution to this problem. MEMS sensor 400 includes a package housing, outer cap, wire bonds, and pins much as described above with respect to MEMS sensor 200. However, package housing 426 and pedestal 416 each include two pressure ports 424 and 438, which provide fluid communication with opposite sides of diaphragm 412 for pressures P1 and P2, respectively. A third pressure, P3, is maintained in space 444, which is sealed off from exterior conditions to protect the inner components from adverse elements and conditions. FIG. 9 shows sensor 400 in a condition where P1≈P2≈P3. If conditions approach P1≈P2>P3, for example, topping wafer 428 can deflect into space 444 due to the force caused by the pressure differential between P2 and P3, as indicated in FIG. 10. This result is referred to as a line pressure effect. In this condition, the deflection of topping wafer 428 can induce stress/deflection on diaphragm 412, as indicated in FIG. 10, which in turn leads to pressure sensor error. So depending on the operating pressures P1 and P2, the line pressure effect can lead to errors despite pedestal 416 mitigating packaging stress. In FIG. 10, the deflections are exaggerated for clarity.

Figure 11:
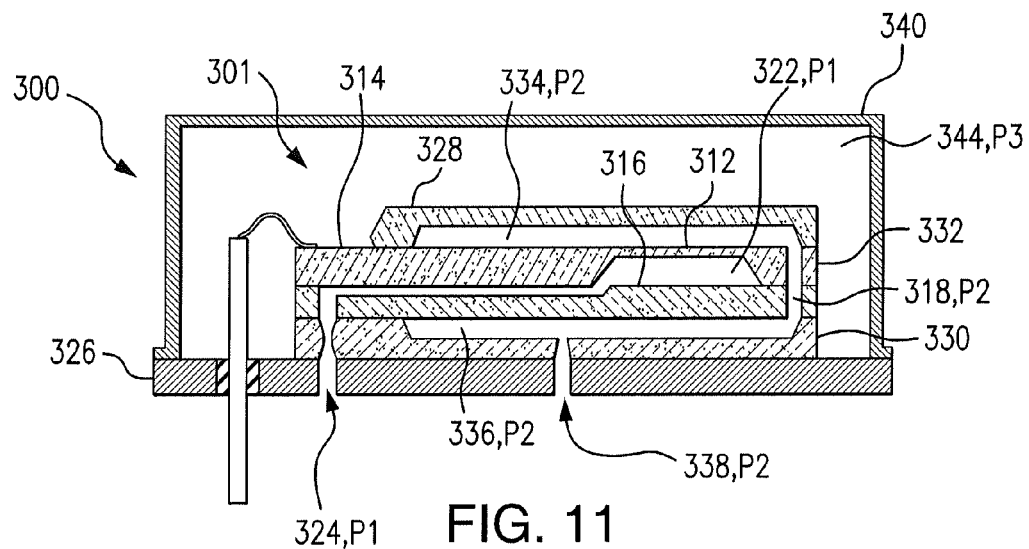
FIG. 11 is a cross-sectional elevation view of the MEMS pressure sensor of FIG. 5, showing the MEMS pressure sensor mounted in a package with two pressure ports each sealed off from the wire bond space.

Referring now to FIG. 11, MEMS sensor 300 can mitigate the line pressure effect described above as well as mounting and packaging stress transmitted to the topping and base wafers by employing MEMS die 301. It has already been explained above how topping wafer 328, base wafer 330, outer rim 332, and mounting base 314 form a diaphragm enclosure about diaphragm 312 and diaphragm backing portion 306 for mitigation of mounting and packaging stress on diaphragm 312. The sensor package includes sensor housing 326 and outer cap 340 enclosing the diaphragm enclosure. A hermetically sealed space 344 defined between the sensor package and the diaphragm enclosure protects the diaphragm enclosure from ambient conditions. Each of the first and second pressure ports 324 and 338 of the diaphragm enclosure is in fluid communication with a respective pressure opening through package housing 326 for connection to respective pressure sources at pressures P1 and P2. If absolute pressure sensing is desired, one of the first or second pressure spaces can be hermetically sealed, e.g., by plugging pressure port 324 or 338 or by not forming either one of the first and second pressure ports during manufacture, for sensing absolute pressure of an external pressure source in fluid communication with the non-plugged pressure port 324 or 338.

With continued reference to FIG. 11, the isolation cavity that includes topping and base voids 334 and 336 essentially creates a smaller package within the sensor package. Topping wafer 328 does not connect directly to diaphragm 312 but does connect outside the P2 pressure space while leaving room on mounting base 314 so the wire bonds can still be contained in a hermetic environment. Another advantage of the isolation cavity design is that the P2 pressure port placement in base wafer 330 is flexible and defined by only one mask layer. Flexibility in port placement and sensor type can easily be achieved by a simple mask change to fabricate base wafer 330, including having a port through the side of base wafer 330, as shown for example in FIG. 15 described below, in addition to through the bottom of wafer 330.

In traditional passive pressure sensors, sensitive high impedance signals travel from the device, e.g., MEMS die, through wire bonds to pins which are soldered to other wires and/or connected to circuit boards where the signal reaches an instrumentation amplifier. This signal can be corrupted by humidity, thermocouple effects between different materials, or other electrical signals. This signal degradation can be overcome or avoided by integrating the signal conditioning electronics into the hermetic environment inside the package.

Figure 12:
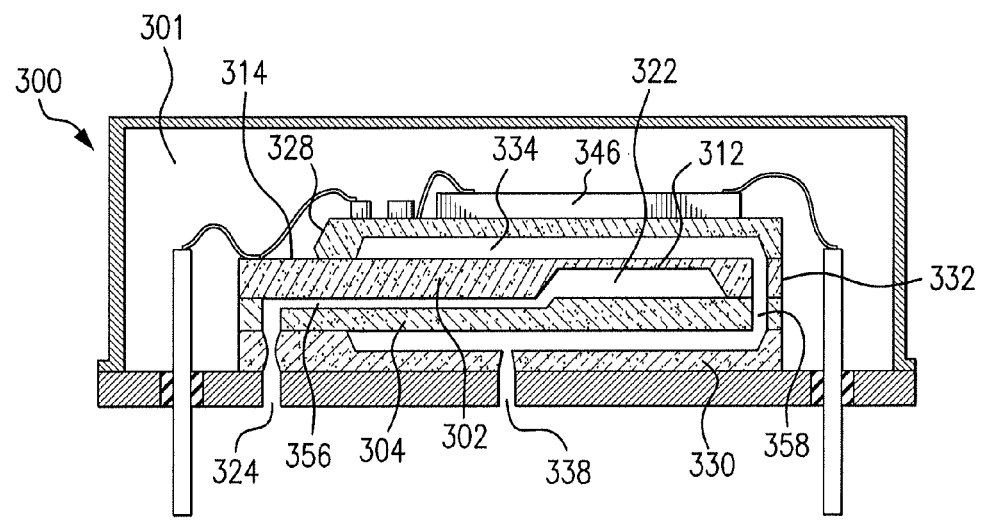
FIG. 12 is a cross-sectional elevation view of the MEMS pressure sensor of FIG. 11, showing integrated electronics components mounted to the topping wafer.

Referring now to FIG. 12, topping wafer 328 and base wafer 330 of the MEMS die 301 can easily accommodate integrated electronics components 346. Topping and base wafers 328 and 330 can be subjected to stress, but since they do not directly contact diaphragm 312 or its surrounding isolation region, the stress does not transfer to diaphragm 312. This creates packaging and integration opportunities. Topping and base wafers 328 and 330 are ideal locations for integrated electronics components 346, since MEMS die 301 can be made of silicon and will therefore have no significant thermal expansion mismatch with the integrated electronics, which can be Application Specific Integrated Circuits (ASIC's), for example. Since silicon is a good thermal conductor, the temperature of integrated electronics components 346 will closely match the temperature of MEMS die 301. Thin film metal wiring can be incorporated into topping wafer 328 itself for routing signals, eliminating the need for an additional substrate. Even further integration can be achieved by forming topping wafer 328 and/or backing wafer 330 out of a CMOS wafer with electronics already fabricated therein.

In addition to or in lieu of integrated electronics components 346 mounted to topping wafer 328, integrated electronics can be mounted to or integrated within base wafer 330, outer rim 332, and/or mounting base 314, or any other suitable location on the diaphragm enclosure of MEMS die 301. The integrated electronics 346, topping wafer 328, and base wafer 330 can all be substantially formed of silicon. The backing and diaphragm substrates 304 and 302 can be silicon layers. While silicon has been provided as an exemplary material, those skilled in the art will readily appreciate that any suitable material can be used for the components described herein without departing from the spirit and scope of the invention.

Topping wafer 328 acts as a shield to the high impedance signals without adding parasitic capacitance since topping wafer 328 is separated from diaphragm 312 by topping void 322, which if filled with air, for example, is a relatively large air gap. This is an improvement over shielding via thin films, which creates significant parasitic capacitance due to the thin dielectric films. Other possible shielding measures include a thin film layer of topping wafer 328 for routing to distant wire bonds, a wiring substrate attached to the toping wafer 328, and an epoxy overfill over the entire MEMS die 301. Also, the getter film or another conductive layer, properly biased or grounded, may function as a ground plane shield.

It is also contemplated that a passive filter for particle contamination can be incorporated into die 301. By making the paths 356 and 358 from pressure ports 324 and 338 to diaphragm 312 smaller than the diaphragm etch depth, large particles that can restrict diaphragm motion are prevented from reaching diaphragm 312. The flow passage of paths 356 and 358 each have a cross-section, the smallest linear dimension of which, e.g., the thickness, is smaller than that of the respective sensor cavity, e.g., diaphragm void 322 in fluid communication therewith adjacent to the media sensor, e.g., diaphragm 312.

Figures 13, 14:
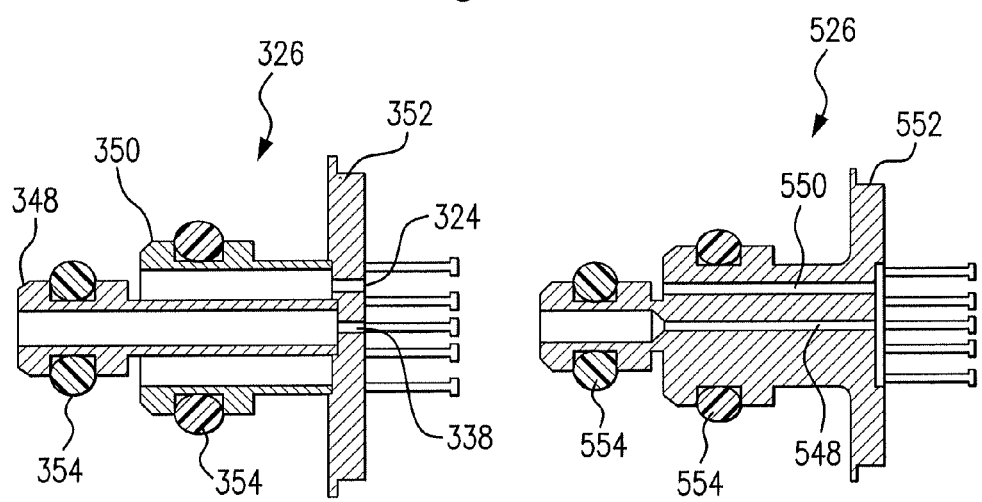
FIG. 13 is a cross-sectional elevation view of an exemplary package housing for mounting a MEMS sensor in accordance with the present invention, showing a concentric brazed tube configuration.
FIG. 14 is a cross-sectional elevation view of another exemplary package housing for mounting a MEMS sensor in accordance with the present invention, showing a unitary configuration.

With reference now to FIGS. 13 and 14, since the diaphragm enclosure of MEMS die 301 is in effect a package itself formed at the die level, the requirements on the package housing are reduced compared to other dies. This allows for lower cost package housings to be used. FIG. 13 shows an example of a low cost housing package 326, wherein concentric tubes 348 and 350 are brazed to platform 352 for fluid communication with pressure ports 338 and 324, respectively. FIG. 14 shows an example of a more costly housing package 526, in which the inner and outer pressure tubes 548 and 550 are formed integrally with platform 552. A MEMS die as those described above with two pressure ports can be mounted to platform 352 or 552 with the respective pressure ports aligned. O-rings 354 and 554 provide a seal when the respective package housing 326 or 526 is mounted in a pressure fixture for differential pressure measurement. While the package housings described herein are metallic, and may involve brazing, those skilled in the art will readily appreciate that any other suitable materials and joining techniques can be used without departing from the spirit and scope of the invention.

Figure 15:
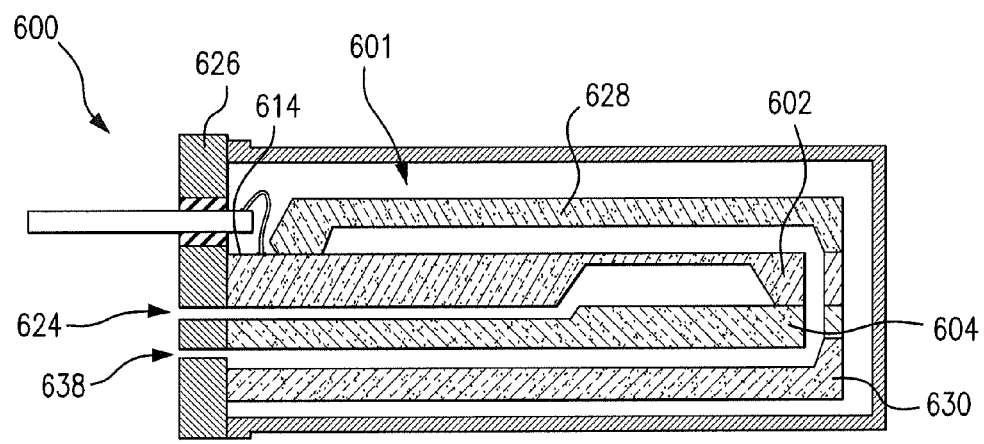
FIG. 15 is a cross-sectional elevation view of another exemplary embodiment of a MEMS pressure sensor constructed in accordance with the present invention, showing the two pressure ports communicating laterally from the voids through the package housing.

Referring now to FIG. 15, an isolation cavity, e.g., as in MEMS die 301, can be mounted in various ways. One exemplary configuration is MEMS die 601 of sensor 600, in which the side of the die, i.e., lateral edges of diaphragm substrate 602, base substrate 604, and base wafer 630, is mounted to the package housing 626 instead of the outward facing surface of base wafer 630 being mounted to the package housing as in MEMS die 301 above. This allows for a smaller die size since space does not need to be allocated to route the pressure ports 624 and 638 to base wafer 630. Another advantage is a more direct path for the pressure routing, allowing the die to drain better, for example if water is introduced into MEMS die 601 through use.

Yield gains can be realized by the isolation cavity configurations described above, e.g., MEMS dies 301 and 601, by pre-etching the topping wafer, e.g., toping wafers 328 and 628, prior to bond. Normally the cutouts are diced out by a saw operation, but the dicing process causes slurry to pelt the bond pad thin films causing shorting to the substrate. By replacing the dicing process with a bulk etch process, in addition to eliminating the saw operation failures, a single wafer process requiring an expensive dicing machine is replaced with a batch wafer process requiring only an etch tank.

The wire bond pad shelf, e.g., the upward facing part of mounting base 314 in FIG. 11 and mounting base 614 in FIG. 15, needs to be large enough to accommodate the head of a wire bond machine. By using an etchant such as potassium hydroxide (KOH) that etches preferentially along the crystalline planes in silicon, for example, the edges of the openings in the topping wafer can be tapered to accommodate the wire bond head without increasing the shelf length. This feature can be accomplished with only two masks, by first opening the top mask and etching the top side, then opening the mask in the bottom and finishing the etch until the via is formed in the topping wafer.

The isolation cavity configuration is not trivial to manufacture. All four substrates/wafers cannot be bonded simultaneously since the backing and diaphragm substrates, e.g., substrates 302 and 304, isolate the diaphragm from the rest of the die and bonding forces, which must not be transmitted to the sense element portion of the MEMS device (i.e. pedestal, diaphragm, or the like). Therefore, a two step bonding sequence can be used. First, the backing and diaphragm substrates are bonded together using a high temperature bonding method such as fusion bond, eutectic bond, or a high temperature, high devitrification temperature frit and its bonding process. The stress isolated diaphragm is supported by the bond chuck so bonding forces can be transmitted. Then the topping wafer and base wafer are bonded to the stack using a lower temperature bonding method, such as low temperature frit bonding. This prevents devitrification of the first frit glass during the second frit bond, when frit bonding is used for the first bond.

Figure 16:
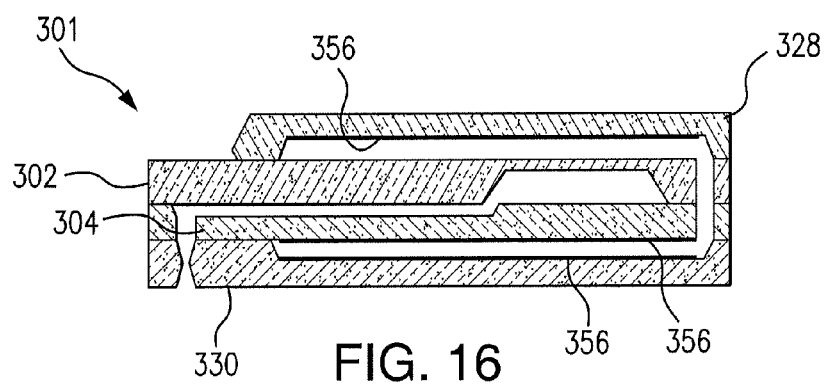
FIG. 16 is a cross-sectional elevation view of the MEMS pressure sensor of FIG. 5, showing getter films applied to the base wafer, topping wafer, and backing substrate.

With reference now to FIG. 16, getter integration for MEMS die 301 is described. Getters are used to maintain a vacuum in a sealed cavity by absorbing gas molecules. For example, thin films of Titanium, Vanadium, or Zirconium are known to absorb gas. Thin film getters can be easily implemented through standard micro fabrication techniques, but are limited in effectiveness by the size of the surface area they are deposited on. The MEMS dies 301 and 601 described above are well suited for thin film getters, since they provide surface area for getter films on the topping wafer, backing substrate, and base wafer surfaces as indicated with heavy lines denoting getters 356 in FIG. 16. Compared to traditional getter configurations in capped MEMS devices of similar size, about three times the getter area can be used because three surfaces are available for getters rather than just one. This allows for vacuum levels within the cavity to be maintained for longer durations or for lower vacuum levels to be achieved, or both. In FIG. 16, an absolute pressure sensor configuration is shown, therefore a port analogous to port 338 shown in FIG. 12, is not included.

Figure 17:
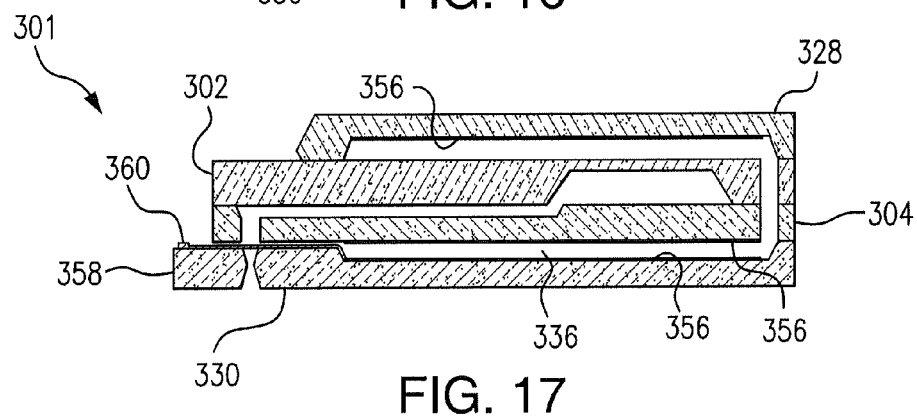
FIG. 17 is a cross-sectional elevation view of the MEMS pressure sensor of FIG. 16, showing getter films with wire bonds pads for enhancing the vacuum.
Figure 18:
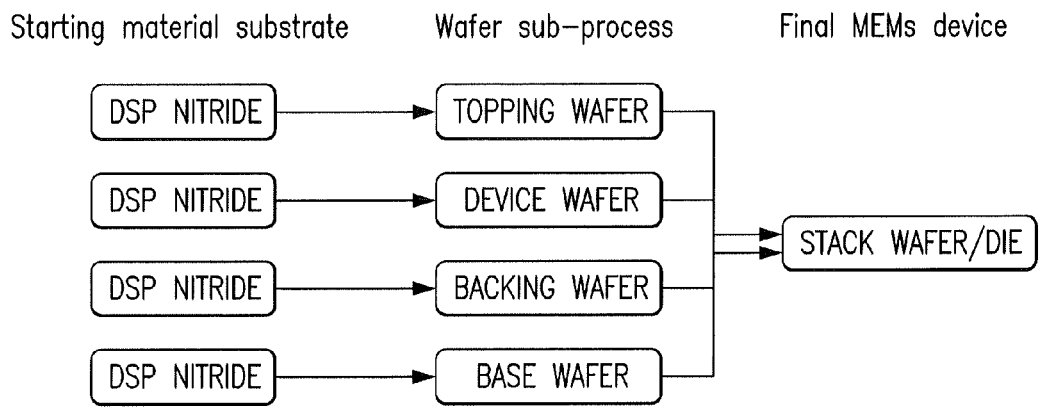
FIG. 18 is a flow chart indicating the sub-processes for manufacturing a MEMS pressure sensor in accordance with the present invention.

Referring now to FIG. 17, getters absorb more gas at higher temperatures than at lower temperatures. A getter can be activated by heating an entire die, but this may be limited by the melting temperature of bonding films such as glass frit or metal eutectics. In MEMS die 301, for example, since base void 336 includes the top surface of base wafer 330, an extension 358 of base wafer 330 provides a place for bond pads 360 so wiring can be connected to the getter 356 on base wafer 330. This getter 356 can then be locally heated via electrical current, to temperatures higher than the bonding films would have allowed through joule heating. Joule heating getter activation allows in-situ activation and reactivation of the getter throughout the life of MEMS die 301.

Since getter materials are typically electrically conductive materials, having an electrical connection to a getter also provides the ability for self-testing. For example, an electrostatic force can be applied to backing wafer 330 and it can be verified that the wafer did not touch the getter via and cause an electrical short. This allows for a MEMS self test to be incorporated into the functionality of MEMS die 301. Similarly, the getter materials may also be patterned to function as electrical traces, capacitive plates, and other electrical components of a MEMS device.

The devices described herein have three general features in common, namely (1) an integrated MEMS device for sensing a physical parameter, (2) an in-situ stress isolation structure/method to prevent the propagation to the MEMS sensor of internal and external stresses from, assembly, mounting, packaging, and the like, and (3) an integrated packaging scheme that is fully part of the MEMS device that also functions as a portion of the stress isolation as well as the encapsulation that protects the MEMS sensing device from both internal and external stress and other detrimental environmental influences such as particles, moisture, condensates, ice, stray pressures, and temperature fluctuations, and the like.

A stress isolated MEMS device may be manufactured from at least four components: a topping wafer, a device wafer, a backing wafer and a base wafer. FIGS. 1-2 show the device and backing wafers already formed and conjoined. An exemplary method to manufacture a stress isolated MEMS device as described above includes first independently forming each of the four components and then their subsequent assembly into a stress isolated MEMS device, as indicated schematically by the flow chart in FIG. 18. An exemplary process for the manufacture of stress isolated MEMS devices such as those described above is explained below with reference to FIGS. 19-23.

Figure 19:
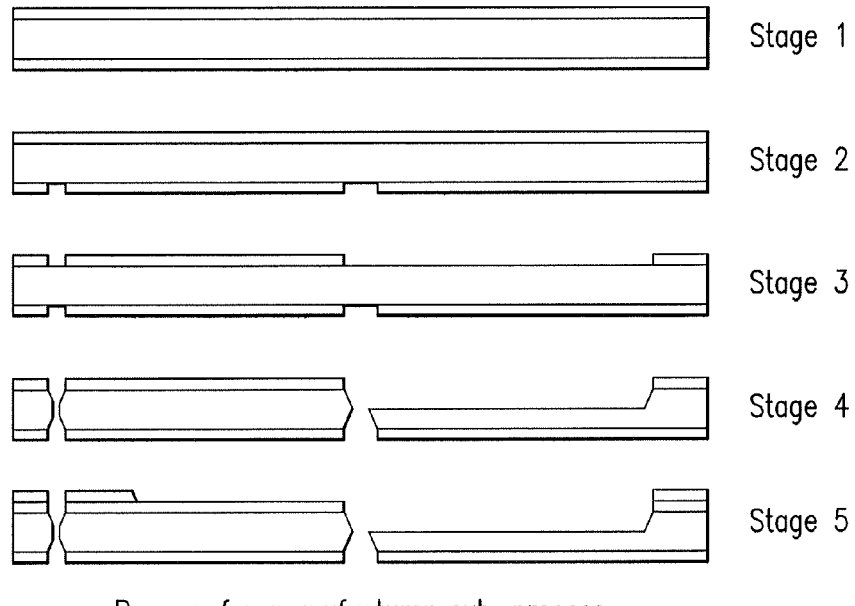
FIG. 19 is a schematic view of a sub-process in five stages for manufacturing a base wafer as indicated in the flow chart of FIG. 18.

With reference first to FIG. 19, a sub-process for forming the base wafer is described. A substrate wafer is formed to have a masking material on its top and bottom surfaces, as indicated schematically in stage 1 of FIG. 19. The substrate can be silicon and the masking material can be silicon nitride. Portions of the bottom surface of the masking material are then patterned as is known in the industry, for example, by using photolithographic techniques, to open areas in the masking material, as represented by stage 2 of FIG. 19. Similarly, portions of the top surface of the masking material are then patterned as is known in the industry, for example by using photolithographic techniques, to open areas in the masking material as indicated by stage 3 of FIG. 19. An etch, or set of etches, are then performed to create depressions in top and or bottom surfaces as well as through holes, as represented by stage 4 of FIG. 19. Preferably, a single etch simultaneously etches the top and bottom surfaces and simultaneously forms both depressions and through holes. Note the depressions and through holes can be advantageously used to form cavities, voids, flow passages, rims, channels, and the like, which might connect various features and allow various functionalities within and between the layers of the final MEMS device, such as fluid communication and stress isolation and protection from unwanted environmental elements, electrical isolation, and the like, as well as to form or delineate MEMS device features such as membranes and pedestals in the final MEMS device. Finally a bonding material that will not impart undue stress to the final device, for example, a first glass frit material, is applied to selected portions of the top surface of the backing wafer, as is known in the art, as indicated in stage 5 FIG. 19. A patterned layer of one or more materials, often metals such as Ti, Zr, and V may then be sputtered through one or more shadow mask windows onto selected areas of the substrate. The metal layer areas may function alone or in conjunction with other structures as electrical interconnections and/or impurity getters, in-situ heaters, fuses, self-test structures, or the like. These metal layer areas are not specifically shown in FIG. 19, but see, e.g., FIG. 17 described above. At this stage, the base wafer component is complete.

Figure 20:
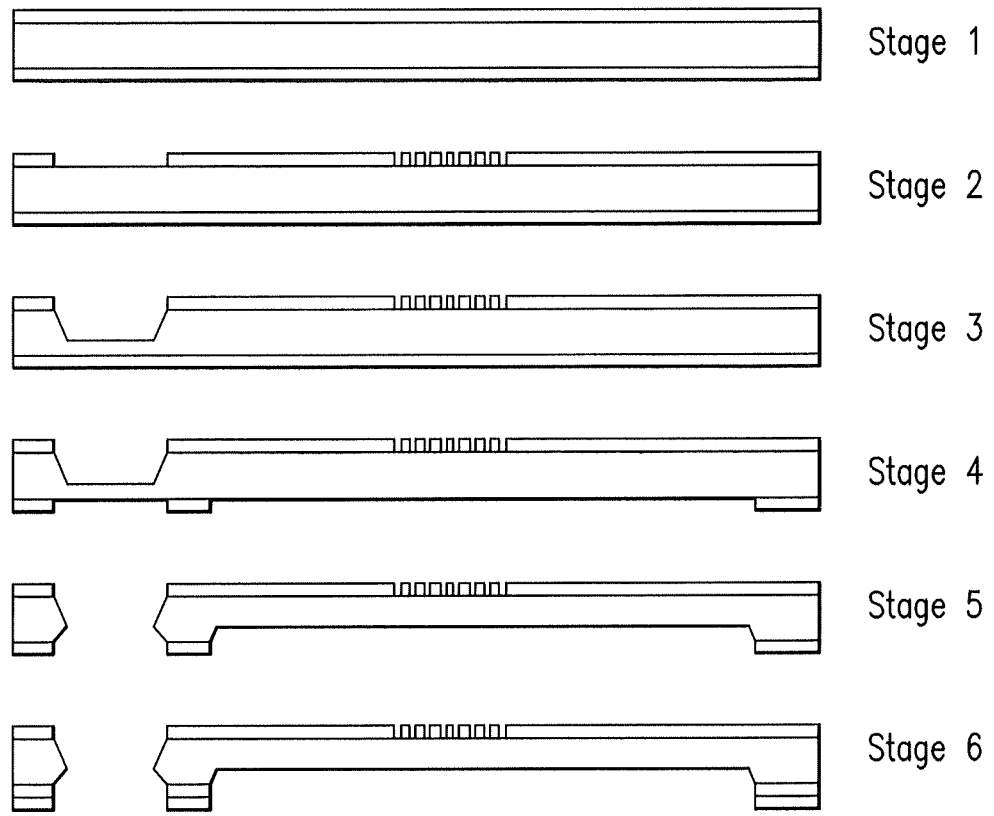
FIG. 20 is a schematic view of a sub-process in six stages for manufacturing a topping wafer as indicated in the flow chart of FIG. 18.

Referring now to FIG. 20, a sub-process for manufacturing a topping wafer is described. A substrate wafer is formed to have a masking material on its top and bottom surfaces, as indicated in stage 1 of FIG. 20. The substrate can be silicon and the masking material can be silicon nitride. A first portion of the top surface of the masking material is then patterned as is known in the industry, for example by using photolithographic techniques, to open an area in the masking material, as indicated by stage 2 of FIG. 20. An etch of the substrate, as is known in the industry, is then performed to form a depression in the substrate in the open area of the substrate, as indicated by stage 3 of FIG. 20. The portions of the masking material on the bottom surface of the substrate are then similarly patterned and etched, as indicated in stage 4 of FIG. 20, then the Si substrate is etched, such that at least one through hole is formed in the substrate in at least one first region of the substrate corresponding to the location of the patterned and etched areas on the top surface of the substrate, and at least one depression is formed in another region of the bottom surface of the substrate, as indicated by stage 5 of FIG. 20. The depressions and through holes can be advantageously used to foam cavities, voids, flow passages, rims, channels, and the like, which might connect various features and allow various functionalities within and between the layers of the final MEMS device, such as fluid communication and stress isolation and protection from unwanted environmental elements, and the like, as well as to form or delineate MEMS device features such as membranes and pedestals, and to electrically isolate portions of the substrate from other portions of the substrate in the final MEMS device. Finally a bonding material that will not impart undue stress to the final device, such as a glass frit material, and advantageously the same material that was applied to the base wafer, is applied to selected portions of the top surface of the topping wafer, as is known in the art, as indicated in stage 6 of FIG. 20. A patterned layer of one or more materials, often metals such as Ti, Zr, and V may then be sputtered through one or more shadow mask windows onto selected areas of the substrate. The metal layer areas may function alone or in conjunction with other structures as electrical interconnections and/or impurity getters, in-situ heaters, fuses, self-test structures, or the like. These metal layer areas are not specifically shown in FIG. 20, but see, e.g., FIG. 17 described above. At this stage, the topping wafer component is complete.

Figure 21:
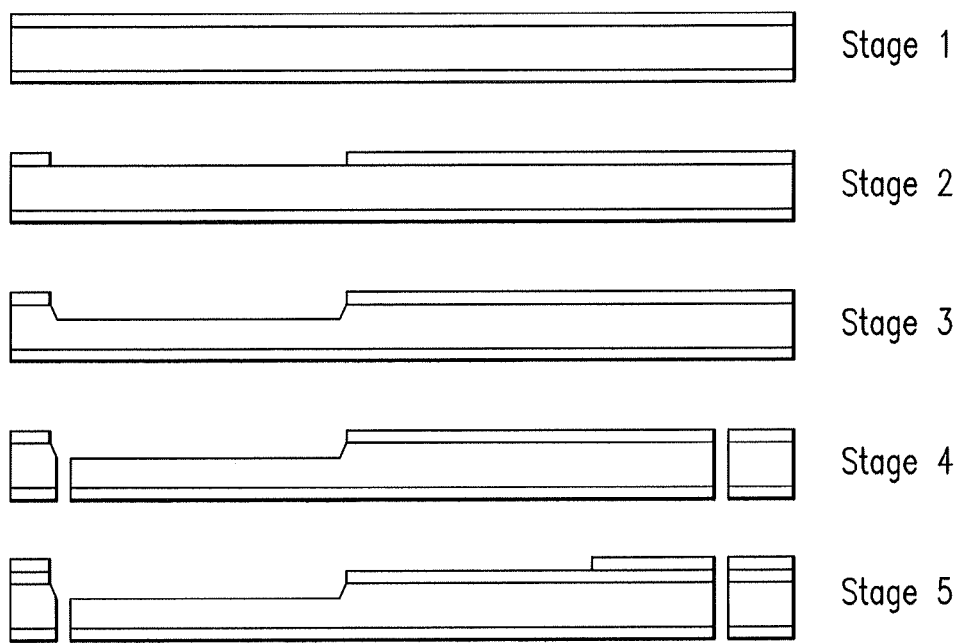
FIG. 21 is a schematic view of a sub-process in five stages for manufacturing a backing wafer as indicated in the flow chart of FIG. 18.

With reference now to FIG. 21, a sub-process for manufacturing a backing wafer is described. A substrate wafer is formed to have a masking material on its top and bottom surfaces as represented by stage 1 of FIG. 21. The substrate can be silicon and the masking material can be silicon nitride. A first portion of the top surface of the masking material is then patterned as is known in the industry, for example, by using photolithographic techniques, to open an area in the masking material as indicated in stage 2 of FIG. 21. An etch of the substrate, as is known in the industry, is then performed to form a depression in the substrate in the open area of the substrate as indicated in stage 3 of FIG. 21. A photolithographic pattern is applied to the top surface of the substrate, and an etch is done that forms through-holes through the entire substrate, including through at least one portion of the masking material, as well as in at least one area that was previously etched and at least one area that was not previously etched as indicated in stage 4 of FIG. 21. This etch may preferably be an anisotropic etch, and may be done using Deep Reactive Ion Etch (DRIE) technology, as is known in the art. The depressions and through holes can be advantageously used to form cavities, voids, flow passages, rims, channels, and the like, which might connect various features and allow various functionalities within and between the layers of the final MEMS device, such as fluid communication, stress isolation, protection from unwanted environmental elements, and the like, as well as to form or delineate MEMS device features such as membranes and pedestals in the final MEMS device, and to electrically isolate portions of the substrate from other portions of the substrate. Finally a second bonding material that will not impart undue stress to the final device, such as a second glass frit material of a higher bonding (i.e., transition and/or devitrification) temperature than the first glass frit material, is applied to selected portions of the top surface of the backing wafer, as is known in the art, indicated by stage 5 of FIG. 21. A patterned layer of one or more materials, often metals such as Ti, Zr, and V may then be sputtered through one or more shadow mask windows onto selected areas of the substrate. The metal layer areas may function alone or in conjunction with other structures as electrical interconnections and/or impurity getters, in-situ heaters, fuses, self-test structures, or the like. These metal layer areas are not specifically shown in FIG. 21, but see, e.g., FIG. 17 described above. At this stage the topping wafer component is completed.

Figure 22A:
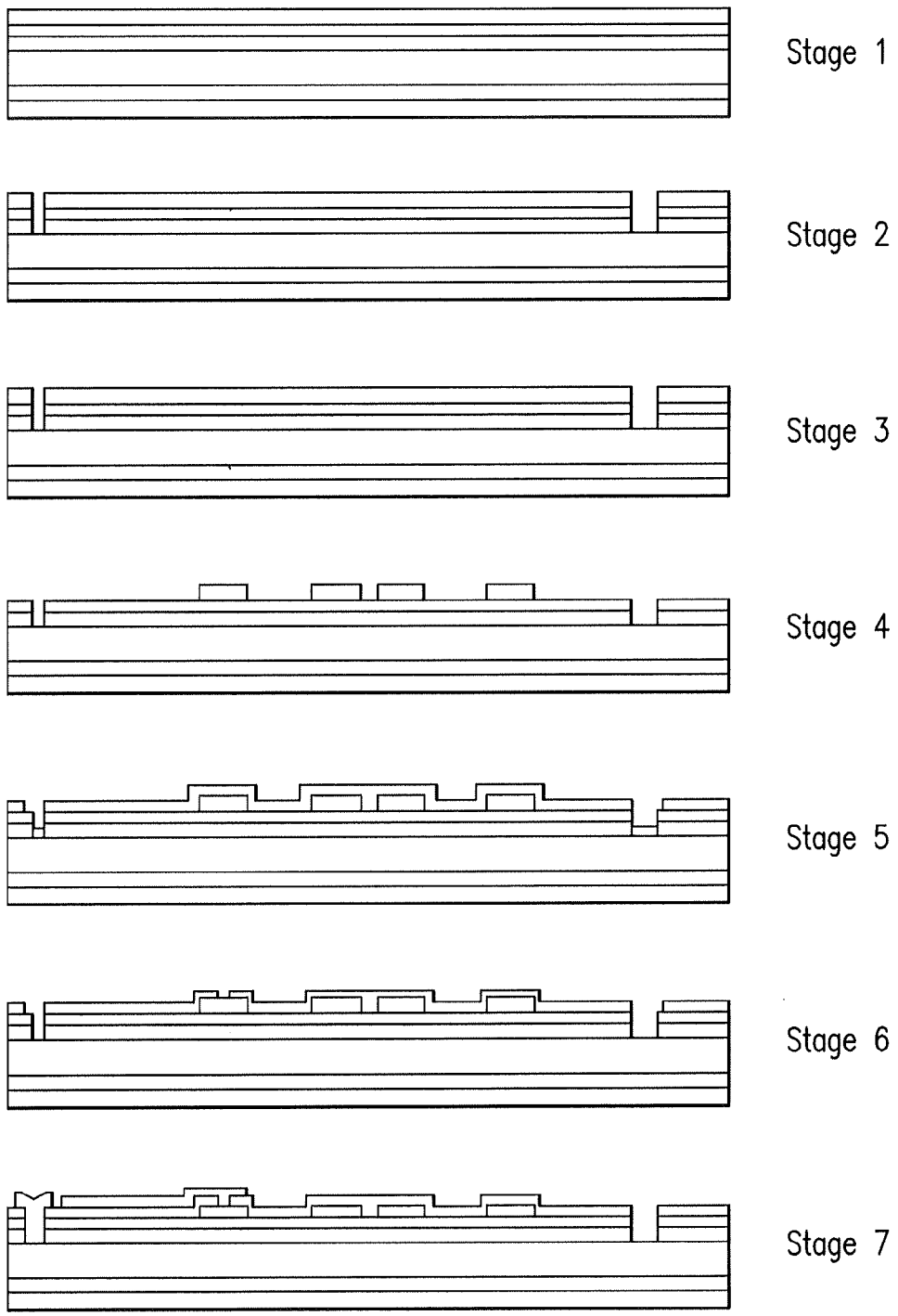
FIGS. 22A and 22B are schematic views of a sub-process in twelve stages for manufacturing a device wafer as indicated in the flow chart of FIG. 18.
Figure 22B:
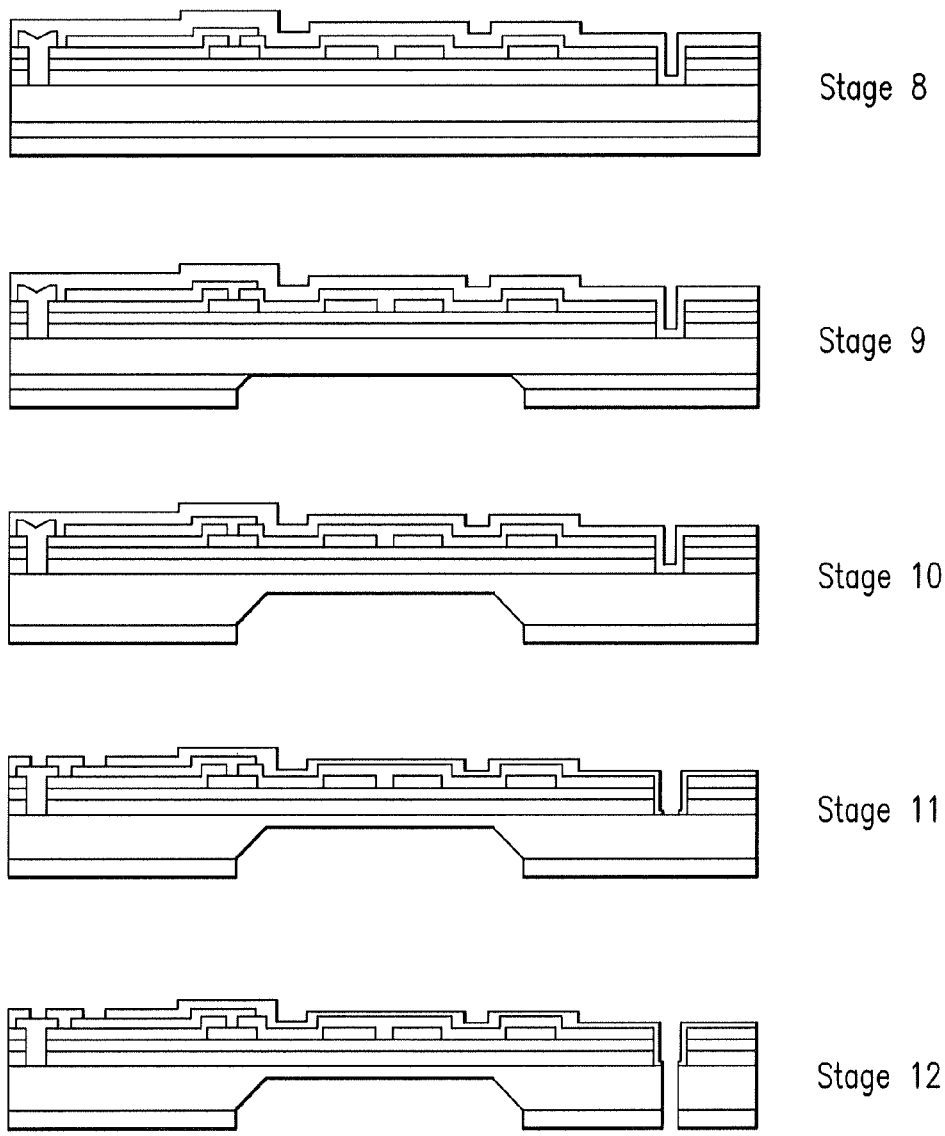

Referring now to FIGS. 22A and 22B, a sub-process for manufacturing a device wafer is described. A substrate wafer is formed to have a masking material on its top and bottom surfaces. The substrate can be silicon and the masking material can be silicon nitride. A second material is applied to the top of the substrate. The second material may be a deposited silicon dioxide film. A polysilicon layer is then deposited on the wafer, resulting in the structure represented in stage 1 of FIG. 22A. The top of the wafer is then masked and etched as is known in the industry, such that the portions of the silicon substrate are exposed as indicated in stage 2 of FIG. 22A. An oxide film is then grown on the exposed portions of the silicon substrate and on the polysilicon. The oxide is not explicitly shown on in FIG. 22A. The substrate is then implanted with an n-type dopant, such as phosphorus, through the oxide film into the polysilicon and into the silicon substrate in those areas that had the masking material etched to expose the silicon substrate as indicated in stage 3 of FIG. 22A. The polysilicon film is then masked and portions of the polysilicon are etched as indicated in stage 4 of FIG. 22A. The etched, doped polysilicon may be used to form precision resistors, piezoresistive elements, electrical conduits, plates of a capacitor, gates, and other electrical and structural components of a MEMS device as is known in the industry. A third material, typically an electrically insulating film such as a deposited silicon dioxide film, is then applied as indicated in stage 5 of FIG. 22A. The surface is then masked and etched to open electrical contacts through the insulating layer to portions of the polysilicon and silicon substrate as indicated in stage 6 of FIG. 22A. A metal film is then applied and patterned to four electrical contacts in the contact areas as well as interconnects fuses, resistors, and input/output pads, self-test structures, capacitor plates, and the like, on the surface of the substrate as shown in stage 7 of FIG. 22A. A passivating film, typically a silicon nitride, is then applied to the top surface of the substrate as indicated in stage 8 of FIG. 22B. A photolithographic mask is then applied to the bottom side of the substrate and the masking material films are etched to expose portions of the silicon as shown in stage 9 of FIG. 22B. The photolithographic mask is stripped. The silicon is then etched to an advantageous thickness, forming a depression in the silicon as shown in stage 10 of FIG. 22B. The depressions can be advantageously used to form cavities, voids, flow passages, rims, and channels which might connect various features and allow various functionalities within and between the layers of the final MEMS device, such as fluid communication and stress isolation and protection from unwanted environmental elements, and the like, as well as to form or delineate MEMS device features such as membranes, rims, or other sensing elements in the final MEMS device. Preferably the depression depth is carefully controlled to form a membrane of an advantageous thickness which may be used as a sensing element, for example in a pressure sensing device. In the case where the silicon etch is done with a wet etchant, a sacrificial blanket masking material, such as ProTEK® B3 wet etch protective coating from Brewer Science, Inc. of Rolla, Mo., can be applied to the top surface of the substrate prior to the wet etch to protect the top surface from the wet etchant. Once the etch is completed, the sacrificial blanket masking material is removed and this step, which is known in the industry, is not shown in FIG. 22B. A photolithographic mask is applied to portions of the top surface and an etch of the passivating film is performed to allow both electrical contacts to be formed through the passivating film to the metal and to open portions of the substrate to expose the silicon as shown in stage 11 of FIG. 22B. A subsequent photolithographic mask is applied to portions of the top surface and an etch is performed to form through holes in the silicon substrate as indicated in stage 12 of FIG. 22B. The through-hole etch may advantageously be an anisotropic etch, and may be done using Deep Reactive Ion Etch (DRIE) technology, as is known in the art. The through holes can be advantageously used to form voids, flow passages, channels, and the like, which might connect various features and allow various functionalities within and between the layers of the final MEMS device, such as fluid communication and stress isolation and protection from unwanted environmental elements, and the like, as well as to form or delineate MEMS device features such as pedestals, and to electrically isolate portions of the substrate from other portions of the substrate in the final MEMS device. A patterned layer of one or more materials, often metals such as Ti, Zr, and V may then be sputtered through one or more shadow mask windows onto selected areas of the substrate. The metal layer areas may function alone or in conjunction with other structures as electrical interconnections and/or impurity getters, in-situ heaters, fuses, self-test structures, or the like. These metal layer areas are not specifically shown in FIGS. 22A and 22B, but see, e.g., FIG. 17 described above. At this stage, the device wafer component is completed.

Figure 23:
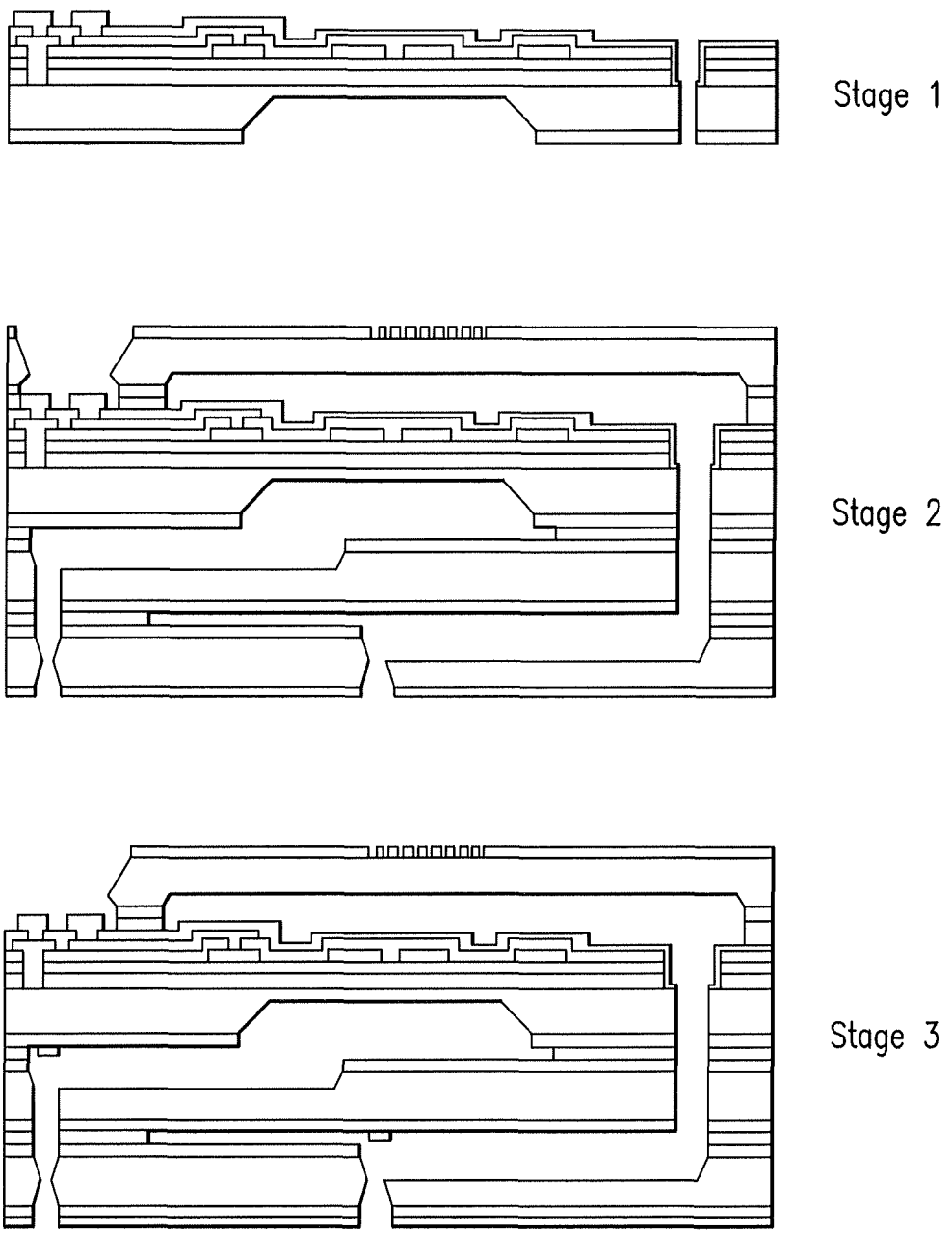
FIG. 23 is a schematic view of a sub-process in three stages for manufacturing a component wafer stack as indicated in the flow chart of FIG. 18.

With reference now to FIG. 23, a sub-process for manufacturing the component wafer stack is described. To complete the final stress isolated sensing MEMS device, the device, base, topping, and backing wafers must be joined together. First the bottom surface of the device wafer and the top surface of the backing wafer are appropriately aligned and then are bonded together with the first glass frit material that had been applied to the top surface of the backing wafer, as is known in the industry. The top surface of the bonded pair, which is the top surface of the device wafer component, then has a metal layer patterned upon it to form features such as electrical interconnects, fuses, capacitor plates, resistors, and metal input/output pads, and the like, as indicated in stage 1 of FIG. 23. The metal can be patterned through a shadow mask as it is being deposited. The bottom surface of the topping wafer and the top surface of the backing wafer are then aligned to the top surface of the bonded pair and the bottom surface of the bonded pair, respectively, and then are bonded together as indicated in stage 2 of FIG. 23. This bond may advantageously be done at a temperature lower than the bond that joined the device wafer with the backing wafer. This can keep the first frit material from devitrifying during the second bond process, thus assuring the integrity of the bonds made by both frit materials. If advantageous to do so, a layer of at least one metallic material, such as Zr, Ni, and Au may then be applied to the bottom surface of the wafer stack. The metal layers may function as electrical interconnections or facilitate fixing the finished device to a header, package, electrical circuit card, or the like, as shown in stage 3 of FIG. 23.

The device, base, topping, and backing wafers (and thus the final assembled stress-isolated MEMS sensing device) may each have at least one MEMS device per wafer formed upon them simultaneously, as is known in the art. In the case that the wafers have more than one device foamed upon them, the wafer stack may be singulated into individual MEMS devices. This completes the manufacturing process for an exemplary embodiment of a stress isolated MEMS device.

While shown and described in the exemplary context of MEMS pressure sensors, those skilled in the art will readily appreciate that the packaging stress isolation systems and methods described above can readily be applied to any suitable devices. For example, the systems and method described above can be applied to MEMS gyros, electronics chips, or any other suitable devices where packaging stress is an issue that can affect performance. It is also contemplated that the stress-sensitive or stress isolated component can include any suitable type of media sensor, such as a humidity sensor, flow sensor, chemical sensor, gas analyzer, particle detector, pressure sensor, and/or any other suitable type of media sensor, in addition to a physical parameter sensor such as a rate sensor or acceleration sensor.

Those skilled in the art will readily appreciate that the invention can be practiced in the form of any suitable microstructure device with a device body having a stress-isolated region including at least one stress-sensitive component. The microstructure device can include a mounting base configured and adapted to be affixed to a package housing the device body, wherein the mounting base is laterally offset from the stress isolated region along the device body for isolating the stress-sensitive component from packaging stress imparted on the mounting base.

Those skilled in the art will also readily appreciate that the device body can be a planar wafer component, such as a single crystal silicon wafer component for example, defining the stress-sensitive component, stress isolated region, and mounting base. Moreover, those skilled in the art will readily appreciate that an exemplary pedestal as described above having a width less than that of the stress-isolated region and of the mounting base is optional as stress isolation can be accomplished in accordance with the invention with or without a narrow pedestal separating the mounting base from the stress-isolated region.

The methods and systems of the present invention, as described above and shown in the drawings, provide for MEMS pressure sensors with superior properties including packaging and mounting stress mitigation, smaller size, and increased accuracy. While the apparatus and methods of the subject invention have been shown and described with reference to preferred embodiments, those skilled in the art will readily appreciate that changes and/or modifications may be made thereto without departing from the spirit and scope of the subject invention.

What is claimed is:
1. A microstructure device comprising:
   a die device body including:

a stress-isolated diaphragm region including a diaphragm, wherein the stress-isolated diaphragm region includes a void;

a mounting base configured and adapted to be affixed to a package housing the die device body, wherein the mounting base is laterally offset from the stress isolated diaphragm region along the die device body for isolating the diaphragm from packaging stress imparted on the mounting base; and a package mounted to a lateral edge of the mounting base, wherein the lateral edge of the mounting base faces away from the stress-isolated diaphragm region of the die device body, and wherein the package includes a first laterally facing pressure port in fluid communication with a laterally extending path through the mounting base for fluid communication between the void and the first laterally facing pressure port through the path, wherein the package includes an outer cap surrounding the die device body forming an enclosure around the die device body, wherein a second laterally facing pressure port is defined in the package for fluid communication with the enclosure on a side of the diaphragm opposite the void.

2. A microstructure device as recited in claim 1, wherein the die device body is a planar wafer component defining the diaphragm and mounting base.

3. A microstructure device as recited in claim 2, wherein the stress-isolated diaphragm region and the mounting base are separated by a pedestal defined in the die device body, the pedestal having a width less than that of the stress-isolated diaphragm region and of the mounting base.

4. A microstructure device as recited in claim 1, wherein the stress-isolated diaphragm region, diaphragm, and mounting base are all defined in a single crystal silicon wafer component.

5. A microstructure device as recited in claim 1, wherein the die device body includes a topping wafer mounted to a top axial surface of the mounting base.

6. A microstructure device as recited in claim 5, wherein the die device body includes a base wafer having a lateral edge mounted to the package, wherein the topping wafer and the base wafer form a diaphragm enclosure in fluid communication with the second laterally facing pressure port, wherein the second laterally facing pressure port is defined between the lateral edge of the base wafer and the lateral edge of the mounting base.

7. A MEMS pressure sensor comprising:
a backing substrate including a diaphragm backing portion and a pedestal portion;
a diaphragm substrate including a pedestal portion and a diaphragm mounted to the diaphragm backing portion of the backing substrate to form a MEMS die, wherein the pedestal portions of the backing and diaphragm substrates form a pedestal of the MEMS die configured for isolating the diaphragm from packaging stress imparted on a mounting base of the MEMS die opposite the diaphragm across the pedestal, wherein the diaphragm is thinner than a diaphragm rim surrounding at least a portion of the diaphragm, wherein the diaphragm rim is adhered to the diaphragm backing portion of the backing substrate so that a void is defined between the diaphragm and the diaphragm backing portion of the backing substrate;
a package mounted to respective lateral edges of the diaphragm substrate and the backing substrate, wherein a first laterally facing pressure port is defined in the package between a lateral edge of the diaphragm substrate and a lateral edge of the backing substrate, wherein a laterally extending path is defined between the first laterally facing pressure port and the void for fluid communication therebetween, wherein the package includes an outer cap surrounding the MEMS die to form an enclosure around the MEMS die, wherein a second laterally facing pressure port is defined in the package for fluid communication with the enclosure on a side of the diaphragm opposite the void.

8. A MEMS pressure sensor as recited in claim 7, wherein the mounting base of the MEMS die is mounted to the package to isolate the diaphragm from the package for packaging stress mitigation.

9. A MEMS pressure sensor as recited in claim 7, wherein the pedestal portion of the backing substrate is substantially in plane with and narrower than the diaphragm backing portion, and wherein the pedestal portion of the diaphragm substrate is substantially in plane with and narrower than the diaphragm.

10. A MEMS pressure sensor as recited in claim 8, further comprising a topping wafer mounted to a top axial surface of a mounting base portion of the diaphragm substrate defining a topping void between the topping wafer and the diaphragm.

11. A MEMS pressure sensor as recited in claim 10, further comprising a base wafer having a lateral edge mounted to the package with a base void defined between the base wafer and the diaphragm backing portion of the backing substrate, wherein the topping wafer, base wafer and mounting base form a diaphragm enclosure around the diaphragm and diaphragm backing portion for mitigation of packaging stress on the diaphragm from the enclosure, and wherein the second laterally facing pressure port is defined between the lateral edge of the base wafer and the lateral edge of the backing substrate for fluid communication into the diaphragm enclosure.

12. A MEMS pressure sensor comprising:
a diaphragm substrate including a diaphragm substantially surrounded by a diaphragm rim; and
a backing substrate having a diaphragm backing portion mounted to the diaphragm rim to form a MEMS die with a diaphragm void defined between the diaphragm and the backing portion, wherein a channel is defined through the diaphragm and backing substrates, a portion of the channel substantially surrounding the diaphragm rim, wherein two ends of the channel define a pedestal therebetween in the diaphragm and backing substrates that is substantially in plane with the diaphragm such that the diaphragm and diaphragm backing portion are suspended from the pedestal for mitigation of packaging stress on the diaphragm imparted on a mounting base of the MEMS die opposite the diaphragm across the pedestal;
a package mounted to respective lateral edges of the diaphragm substrate and the backing substrate, wherein a first laterally facing pressure port is defined in the package between the lateral edge of the diaphragm substrate and the lateral edge of the backing substrate, wherein a laterally extending path is defined between the first laterally facing pressure port and the diaphragm void for fluid communication therebetween, wherein the package includes an outer cap surrounding the MEMS die to form an enclosure around the MEMS die, wherein a second laterally facing pressure port is defined in the package for fluid communication with the enclosure on a side of the diaphragm opposite the void.

13. A MEMS pressure sensor as recited in claim 12, wherein the diaphragm and backing substrates include an outer rim outboard of the portion of the channel substantially surrounding the diaphragm rim, the outer rim being spaced apart from the diaphragm and diaphragm backing portion across the channel.

14. A MEMS pressure sensor as recited in claim 12, further comprising:
   a topping wafer mounted to the diaphragm substrate on the outer rim and mounting base with a topping void defined between the topping wafer and the diaphragm; and
   a base wafer having a lateral edge mounted to the package with a base void defined between the base wafer and the diaphragm backing portion of the backing substrate, wherein the topping wafer, base wafer, outer rim, and mounting base form a diaphragm enclosure around the diaphragm and diaphragm backing portion for mitigation of packaging stress on the diaphragm from the enclosure.

15. A MEMS pressure sensor as recited in claim 14, further comprising an integrated electronics component mounted to one of the topping wafer and base wafer.

16. A MEMS pressure sensor as recited in claim 14, wherein the diaphragm void forms a first pressure space configured to deflect the diaphragm in a first direction under pressure, wherein the topping and base voids are in fluid communication through the channel in the diaphragm and backing substrates to form a second pressure space configured to deflect the diaphragm in a second direction opposite the first direction under pressure.

17. A MEMS pressure sensor as recited in claim 16, wherein the second pressure space is hermetically sealed for sensing absolute pressure of an external pressure source in fluid communication with the first pressure space.

18. A MEMS pressure sensor as recited in claim 16, wherein the first and second laterally facing pressure ports are in fluid communication with the first and second pressure spaces, respectively, wherein the first and second pressure spaces are sealed from one another within the diaphragm enclosure for sensing differential pressure between respective first and second external pressure sources across the diaphragm.

19. A MEMS pressure sensor as recited in claim 14, wherein a hermetically sealed space is defined between the package and the diaphragm enclosure for protecting the diaphragm enclosure from ambient conditions.

* * * * *